(12) United States Patent
Osawa et al.

(10) Patent No.: US 11,994,539 B2
(45) Date of Patent: May 28, 2024

(54) OPTICAL VOLTAGE PROBE

(71) Applicants: SEIKOH GIKEN Co., Ltd., Matsudo (JP); Rohm Co., Ltd., Kyoto (JP)

(72) Inventors: Ryuji Osawa, Matsudo (JP); Noriaki Hiraga, Kyoto (JP)

(73) Assignees: SEIKOH GIKEN Co., Ltd.; Rohm Co., Ltd.

( * ) Notice: Subject to any disclaimer, the term of this patent is extended or adjusted under 35 U.S.C. 154(b) by 176 days.

(21) Appl. No.: 17/770,292

(22) PCT Filed: Mar. 26, 2021

(86) PCT No.: PCT/JP2021/013006
§ 371 (c)(1),
(2) Date: Apr. 20, 2022

(87) PCT Pub. No.: WO2021/205911
PCT Pub. Date: Oct. 14, 2021

(65) Prior Publication Data
US 2022/0291260 A1 Sep. 15, 2022

(30) Foreign Application Priority Data
Apr. 7, 2020 (JP) .................. 2020-068883

(51) Int. Cl.
*G01R 15/22* (2006.01)
*G01R 19/00* (2006.01)
(Continued)

(52) U.S. Cl.
CPC .......... *G01R 15/22* (2013.01); *G01R 19/0084* (2013.01); *G02F 1/0327* (2013.01);
(Continued)

(58) Field of Classification Search
CPC ............. G01R 31/2601; G01R 1/0458; G01R 31/2877; H01R 13/533
See application file for complete search history.

(56) References Cited

U.S. PATENT DOCUMENTS

| 5,808,473 A | 9/1998 | Shinagawa et al. |
| RE46,932 E * | 7/2018 | Sugiyama ............. G02F 1/0305 |

(Continued)

FOREIGN PATENT DOCUMENTS

| GB | 2339918 A | 2/2000 |
| JP | S63-196863 A | 8/1988 |

(Continued)

OTHER PUBLICATIONS

International Search Report for PCT/JP2021/013006 dated Jun. 8, 2021.
PCT written opinion dated Jun. 8, 2021.

*Primary Examiner* — Akm Zakaria
(74) *Attorney, Agent, or Firm* — Yokoi & Co., U.S.A.; Toshiyuki Yokoi

(57) ABSTRACT

An optical voltage probe includes: an optical modulator 1 having two modulation electrodes 11 and 12, the optical modulator 1 being configured to modulate an intensity of an incident light depending on a voltage between the two modulation electrodes and output the incident light which is modulated; an input/output optical fiber 2 connected with the optical modulator 1; two contact terminal attachment portions 5, 6 to which contact terminals 3, 4 can be detachably attached and contacted, the two contact terminals 3, 4 being configured to be in contact with the points to be (Continued)

measured, the two contact terminal attachment portions 5, 6 being respectively connected with the modulation electrodes 11, 12; and a package 8 that houses the optical modulator 1 and a part of the input/output optical fiber 2. A voltage signal induced via the contact terminals 3, 4 is converted into an optical intensity modulation signal. When an electric wave having a measurement frequency is applied while the contact terminal attachment portions 5, 6 are opened, the package 8 exhibits a shielding effect of attenuating the electric wave by 15 dB or more compared to an output signal intensity measured without providing the package.

20 Claims, 7 Drawing Sheets

(51) Int. Cl.
*G02F 1/03* (2006.01)
*G02F 1/035* (2006.01)
*G02F 1/225* (2006.01)

(52) U.S. Cl.
CPC ............ *G02F 1/035* (2013.01); *G02F 1/2252* (2013.01); *G02F 2201/02* (2013.01); *G02F 2202/20* (2013.01)

(56) References Cited

U.S. PATENT DOCUMENTS

| | | | | |
|---|---|---|---|---|
| 2002/0172476 | A1* | 11/2002 | Nagase | ................ G02B 6/4246 |
| | | | | 385/94 |
| 2003/0095737 | A1 | 5/2003 | Welch et al. | |
| 2004/0196037 | A1* | 10/2004 | Xiang | ..................... G01N 24/10 |
| | | | | 324/300 |
| 2005/0254743 | A1* | 11/2005 | Akiyama | ............... H04B 10/58 |
| | | | | 385/3 |
| 2010/0124423 | A1 | 5/2010 | Kagaya et al. | |
| 2017/0255032 | A1* | 9/2017 | Kataoka | .................. G02F 1/035 |

FOREIGN PATENT DOCUMENTS

| | | |
|---|---|---|
| JP | H01-89372 U | 6/1989 |
| JP | H04-288518 A | 10/1992 |
| JP | H08-35998 A | 2/1996 |
| JP | H08-262117 A | 10/1996 |
| JP | H09-33573 A | 2/1997 |
| JP | 2008-298523 A | 12/2008 |
| JP | 2010-123640 A | 6/2010 |
| JP | 2020-8537 A | 1/2020 |
| WO | 99/40449 A | 8/1999 |
| WO | 2016/032002 A | 3/2016 |

* cited by examiner

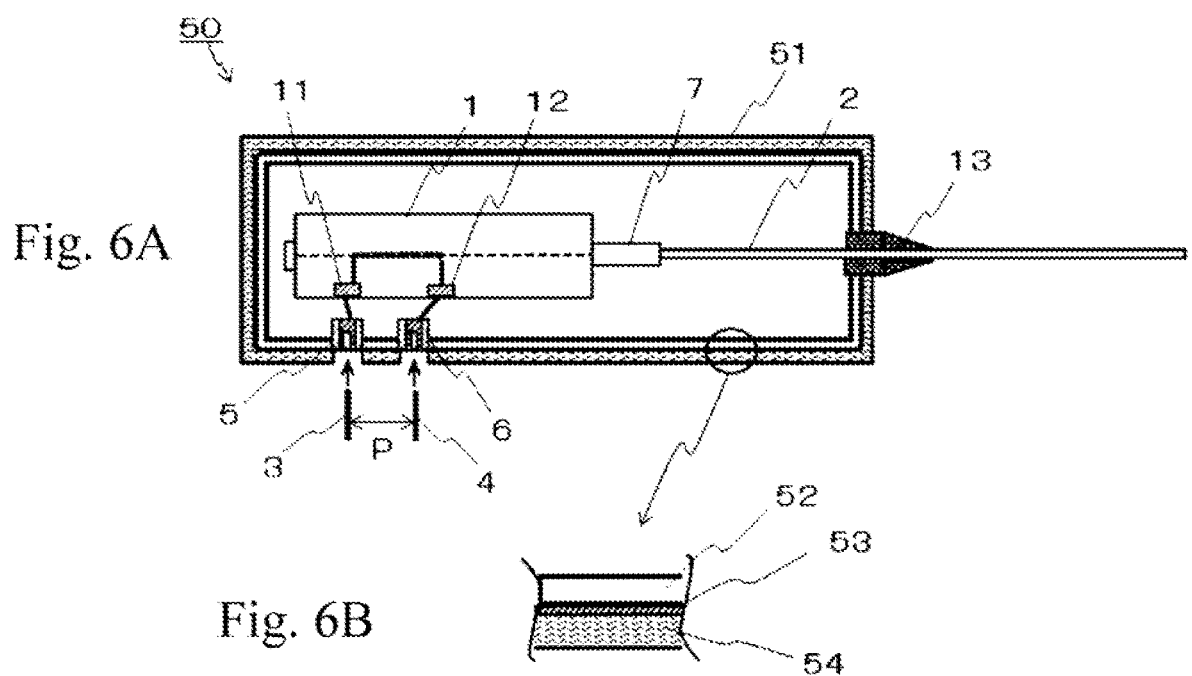

OPTICAL VOLTAGE PROBE

TECHNICAL FIELD

The present invention relates to an optical voltage probe that applies a voltage signal obtained from contact terminals to an optical modulator, converts the voltage signal into an optical modulation signal, and outputs the optical modulation signal through an optical fiber.

BACKGROUND ART

In recent years, various control devices using a high speed CPU or the like have been developed and noise signals generated on an electric circuit board or the like of the control devices are detected and noise resistance tests or the like of the electric circuit board or the like are performed as a malfunction preventive countermeasure. In the above describe tests, it is required to correctly measure input/output signals of electric components installed on the electric circuit board and electrical signals transmitted through wirings.

As for a general method for measuring the electric signals of the electric components and the wirings, the electric signal of the point to be measured is transferred to a measuring instrument such as an oscilloscope by using an electric probe having contact terminals and a voltage waveform or the like of the transferred electric signals is measured. However, when a ground level of the point to be measured is different from that of the measuring instrument or when the voltage signal between ungrounded two points is measured, it is difficult to measure the voltage waveform correctly because of the influence of the mixture of signals from the ground and the capacity of the electric probe, for example. In particular, the above described influence of the ground and the capacity is large in a high frequency region.

Furthermore, an input impedance and an output impedance are not 50Ω in many integrated circuits such as IC and LSI. For example, the input impedance is high and the output impedance is low in an amplifier element. Therefore, when the input noise voltage is measured by using the electric probe having a low input impedance, current flows to the electric probe side and the noise voltage to be measured is lowered.

As for the means for solving the above described problem, a measuring instrument using an optical voltage probe has been developed where the voltage signal is converted into an optical signal and the optical signal is transferred to the measuring instrument through an optical fiber. In the above described method, a capacity component of the probe is extremely low. Thus, the input impedance is extremely high and the point to be measured and the measuring instrument are electrically separated from each other completely. The optical voltage probe can measure even high frequency component. Thus, the influence of the ground can be eliminated and the intrusion of the electric signal noise generated midway can be prevented.

Examples of the above described conventional measuring instruments are described in Patent documents 1 and 2. Patent document 1 describes the optical voltage probe using a bulk type optical modulator. Namely, Patent document 1 describes the configuration that the voltage signal of the contact terminals is applied between two electrodes sandwiching a crystal having an electrooptic effect, an incident light transmitted from an optical fiber is reflected in the crystal to change the polarization state, and the change is converted into a light intensity modulated light through an analyzer, and the light intensity modulated light is transmitted to an O/E converter through the optical fiber.

Patent document 2 describes the optical voltage probe having a waveguide type optical modulator. This obtains an optical intensity modulation signal by applying the voltage signal of the contact terminals between two modulation electrodes of a branch interference type optical modulator formed on a lithium niobate crystal substrate.

A device having a light source and an O/E converter is connected with the optical voltage probe through the optical fiber.

PRIOR ART DOCUMENTS

Patent Documents

[Patent document 1] Japanese Unexamined Patent Application Publication No. S63-196863
[Patent document 2] Japanese Unexamined Patent Application Publication No. H08-35998

DISCLOSURE OF THE INVENTION

Problems to be Solved by the Invention

As described above, in the conventional optical voltage probe, different from the electric probe, the influence of the ground can be eliminated and the intrusion of the electric signal noise generated midway of the wirings to the measuring instrument can be prevented. However, in the conventional optical voltage probe, it is impossible to eliminate the influence of an electromagnetic wave noise transmitted directly to the modulation electrodes propagating in the space around the optical voltage probe. This is because the input impedance of the modulation electrodes of the optical modulator is normally high as described above and the wirings formed midway from the contact terminals to the modulation electrodes function as an antenna for receiving electric waves.

The present invention aims for providing an optical voltage probe capable of solving the above described problems and correctly measuring the voltage signal of the point to be measured without being influenced by a surrounding electromagnetic wave noise.

Means for Solving the Problem

For solving the above described problems, the first viewpoint of the optical voltage probe of the present invention includes an optical modulator having at least two modulation electrodes, the optical modulator being configured to modulate an intensity of an incident light depending on a voltage between the two modulation electrodes and output the incident light which is modulated; an input optical fiber that is connected with the optical modulator; an output optical fiber that is connected with the optical modulator; two contact terminals or two contact terminal attachment portions to which the two contact terminals can be detachably attached and contacted, the two contact terminals being connected with the two modulation electrodes and configured to be in contact with points to be measured; and a package that houses the optical modulator, a part of the input optical fiber and a part of the output optical fiber, wherein a voltage signal induced between the two modulation electrodes via the two contact terminals is converted into an optical intensity modulation signal by the optical modulator and the optical intensity modulation signal is outputted through the output optical fiber, when an electric wave having a measurement frequency is applied while the two contact terminals or the two contact terminal attachment portions are opened, the package exhibits a shielding effect of attenuating the electric wave by 15 dB or more compared to an output signal intensity measured without providing the package.

As described above, in the optical voltage probe of the present invention, the optical modulator is covered with the package having the shielding effect of the electric wave. Thus, the electromagnetic wave noise around the point to be measured is prevented from being received by the modulation electrodes of the optical modulator and the wirings formed midway to the modulation electrodes. In the optical voltage probe, the measurement is performed by bringing the contact terminals into contact with the point to be measured in a circuit substrate or the like. It is possible to form the contact terminals integrally with the optical voltage probe or it is also possible to form the contact terminal attachment portions on the optical voltage probe for enabling to select contact terminals according to purposes. The inventors and other members confirmed by the experiment that the practically sufficient performance could be obtained in the optical voltage probe if the package exhibits a shielding effect of attenuating an electromagnetic wave noise signal by 15 dB or more compared to the electromagnetic wave noise signal received without the package.

In the present invention, a metal is a typical material of the package for obtaining the shielding effect of the electric wave. However, it is also possible to form the package by conductive materials such as a carbon instead of the metal. Furthermore, it is also possible to form the package by the electric wave absorber. The shape of the package can be any shape as long as the optical modulator and the wirings formed midway from the contact terminals to the modulation electrodes are covered with the package and housed inside the package. In addition, if it is known which part of the electrodes and the wirings functions as the antenna for receiving electric waves, it is also possible to adapt the configuration of the package capable of covering only that part by the metal, the conductive material or the electric wave absorber.

In the second viewpoint of the present invention, the optical voltage probe of the first viewpoint is characterized in that the package is configured to cover an inside of the package by a metal body. In this viewpoint of the present invention, the metal body is used as the material of the package since the metal body is the most commonly used and is easily processed. Instead of the method of forming the package by processing the metal such as a metal plate, it is also possible to form the package by an insulating resin, ceramic or the like and provide a metal film for covering the entire outer surface or the entire inner surface of the above described material. In addition, it is also possible to form the package by a plate-shaped material having a metal layer inside. Furthermore, the metal body can be a mesh-shaped metal body having holes sufficiently smaller than the wavelength of the electromagnetic wave to be shielded.

In the third viewpoint of the present invention, the optical voltage probe of the second viewpoint is characterized in that the package has a layered or sheet-shaped metal body. In this viewpoint of the present invention, it is possible to form the package mainly by the resin, ceramic or the like to have necessary strength and provide a metal film for covering the outer surface or the inner surface of the above described material, for example. Various methods can be adopted. For example, a metal film can be vapor-deposited on the surface of the package, a metal tape can be attached on the surface of the package, and a metal plating, a metal material or the like can be applied on the surface of the package. It is possible to combine the material excellent in a manufacturing cost, lightness and the like with the metal film.

In the fourth viewpoint of the present invention, the optical voltage probe of the first to third viewpoints is characterized in that the contact terminal attachment portions are provided and the contact terminal attachment portions are installed inner than a position of a surface of the package. In the optical voltage probe, the length of the contact terminals is preferably as short as possible so that the electromagnetic wave noise is prevented from being received by the contact terminals during measurement. If the contact terminal attachment portions are provided and the contact terminal attachment portions are projected more outward than the package, the length of the whole projected portion becomes long when the contact terminals are connected. Thus, the projected portion functions as an antenna of the electromagnetic wave noise. Accordingly, in this viewpoint of the present invention, the position of the tips of the contact terminal attachment portions is specified to be located inner than the position of the surface of the package.

In the fifth viewpoint of the present invention, the optical voltage probe of the first to fourth viewpoints is characterized in that the package includes an electric wave absorber on a surface or an inside of the package for reducing a reflection of an electromagnetic wave reflected by the package. In the optical voltage probe of the present invention, the modulation electrodes or the like can be prevented from directly detecting a surrounding electromagnetic wave noise since the package having the shielding effect of the electric wave is provided. However, if the electromagnetic wave noise is reflected by the package arranged adjacent to the circuit substrate to be measured and the electromagnetic wave noise is radiated on the portion which functions as an antenna for receiving the circuit substrate or the like to be measured, there is a possibility that the signal of the electromagnetic wave noise is mixed in the signal measured from the contact terminals. In this viewpoint of the present invention, since the electric wave absorber is provided on the package, the electromagnetic wave noise is absorbed and the reflection of the electromagnetic wave noise can be reduced. Consequently, a reflection wave of the electromagnetic wave noise reflected from the package placed adjacent to the point to be measured is reduced. Thus, the influence of the electromagnetic wave noise can be further reduced at the point to be measured.

Although the electric wave absorber is preferably provided on the surface of the package, the electric wave absorber can be formed inside the package as long as it is located more outward than the metal body having the purpose of shielding the electric wave. The electric wave absorber used for this viewpoint of the present invention can be anything as long as it has the function of reducing the reflection of the electric wave. For example, a conductive radio wave absorption material formed by textile or the like of conductive fiber which absorbs the electric current generated by the electric wave by the resistance inside the material, a dielectric radio wave absorption material formed by mixing carbon powder or the like with dielectric materials such as rubber, urethane foam and polystyrene foam for using (increasing) an apparent dielectric loss, and a magnetic radio wave absorption material using iron, nickel, ferrite or the like for absorbing the electric wave by magnetic loss. In addition, the shape of the material can be a sheet-shaped material and a coating-type material, for example.

In the sixth viewpoint of the present invention, the optical voltage probe of the fifth viewpoint is characterized in that the package has a sheet-shaped electric wave absorber provided on a surface of the package. In this viewpoint of the present invention, the sheet of the electric wave absorber can be attached to the surface of the package as a final process when manufacturing the package. Thus, the manufacturing process can be simplified.

In the seventh viewpoint of the present invention, the head of the optical voltage probe of the first viewpoint is characterized in that the package includes the electric wave absorber and the package exhibits the shielding effect of the electric wave and the effect of reducing a reflection of an electromagnetic wave reflected by the package. As described above, the conductive radio wave absorption material, the dielectric radio wave absorption material and the magnetic radio wave absorption material are used as the electric wave absorber. In accordance with the selection of the material and composition, the selection of the thickness and the like, the shielding effect of the electric wave shown in the first viewpoint can be sufficiently obtained in some cases in addition to the effect of absorbing the electric wave. In this case, it is not necessary to separately provide a shielding means formed by the metal body.

In the eighth viewpoint of the present invention, the optical voltage probe of the first to seventh viewpoints is characterized in that an interval between the two contact terminals or an interval between the two contact terminal attachment portions is 3 mm or more. As described above, the input impedance of the optical voltage probe is extremely high. Thus, one of the features of the optical voltage probe is that the electric influence on the point to be measured is small when the contact terminals are in contact with the point to be measured and the voltage signal can be measured correctly. In order to further increase the above described merit, in this viewpoint of the present invention, the interval between the contact terminals or the interval between the contact terminal attachment portions is set to 3 mm or more for further increasing the input impedance. It was confirmed by the experiment of the inventors and other members that there was no influence of the input impedance during the measurement when the above described interval was set to 3 mm or more.

In the ninth viewpoint of the present invention, the optical voltage probe of the first to eighth viewpoints is characterized in that the optical modulator is a branch interference type optical modulator using an optical waveguide formed on a lithium niobate crystal substrate. This viewpoint of the present invention uses the branch interference type optical modulator achieved by the optical waveguide formed on the lithium niobate crystal substrate although it has been conventionally used as the optical modulator. The branch interference type optical modulator is basically composed of an input optical waveguide extended from a light incident side, two phase shift waveguides extended from the input optical waveguide and branched into two, an output optical waveguide at which the two phase shift optical waveguides are joined and connected to a light emission side, and modulation electrodes arranged in parallel with the two phase shift waveguides. The voltage signal is applied to the phase shift optical waveguides via the modulation electrodes, a refractive index of the phase shift optical waveguides is changed, and the light passing through the two phase shift optical waveguides are joined and interfered with each other. Thus, the optical intensity is modulated. Since a small, high efficient and broadband optical modulator can be obtained, it is suitable for the optical voltage probe of the present invention.

In the tenth viewpoint of the present invention, the optical voltage probe of the ninth viewpoint is characterized in that the optical modulator is a reflection type optical modulator where the incident light is reflected inside the optical modulator to change a direction of the incident light, and the input optical fiber and the output optical fiber are formed by one input/output optical fiber. The reflection type optical modulator of this viewpoint of the present invention has the configuration that the incident light is reflected in the phase shift optical waveguide and returned to the optical waveguide of the incident side. When the above described configuration of the reflection type optical modulator is used, the length through which the light is transmitted is twice the length compared to the case where a transmission-type optical modulator having the electrode of the same length is used. Thus, the optical modulator can be more efficient, more broadband and smaller. Furthermore, since the number of the optical fiber connected to the optical modulator is one, handling is facilitated.

In the eleventh viewpoint of the present invention, the optical voltage probe of the ninth or tenth viewpoints is characterized in that at least one electrode capacitively coupled with the two modulation electrodes is provided between the two modulation electrodes. In this viewpoint of the present invention, a so-called split electrode (segmented electrode) formed by a plurality of electrodes which are divided in a longitudinal direction and capacitively coupled with each other is used as the modulation electrodes. In general, when the length along the optical waveguide of the modulation electrodes is longer, the modulation efficiency increases and the sensitivity of detecting the voltage at the optical voltage probe increases. However, when the length of the modulation electrodes increases, the electric capacity increases. When the electric capacity is large, the equivalent impedance decreases as the frequency of the electric signal increases. Thus, the voltage applied to the electrode reduces and the modulation efficiency reduces. Therefore, the capacity of the electrode is preferably as small as possible for detecting high frequency signals. The split electrode formed by dividing one modulation electrode into a plurality of capacitively coupled electrodes is an efficient means for improving the trade-off relation between the length of the modulation electrodes and the electric capacity. The high efficient and broadband optical modulator can be obtained by using the split electrode.

Effects of the Invention

As described above, an optical voltage probe capable of correctly measuring the voltage signal of the point to be measured without being influenced by a surrounding electromagnetic wave noise can be obtained by the present invention.

BRIEF DESCRIPTION OF THE DRAWINGS

FIG. 1A is a plan view of a transmission-type, FIG. 1B shows a side view of the transmission-type, and FIG. 1C shows a partially enlarged cross-sectional view of a contact terminal attachment portion.

FIG. 3A is a plan view and FIG. 3B is an A-A cross-sectional view.

FIG. 5A is a plan view of the transmission-type and FIG. 5B is a partially enlarged cross-sectional view showing the cross-sectional configuration of the package.

FIGS. 6A and 6B are diagrams schematically showing a configuration of an optical voltage probe concerning the third embodiment. FIG. 6A is a plan view of the transmission-type and FIG. 6B is a partially enlarged cross-sectional view showing the cross-sectional configuration of the package.

MODES FOR CARRYING OUT THE INVENTION

Figure 1A:
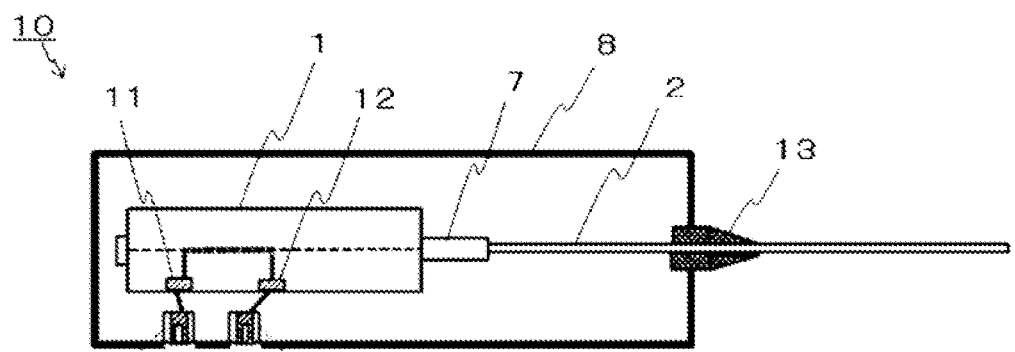
FIGS. 1A to 1C are configuration diagrams schematically showing a configuration of an optical voltage probe concerning the first embodiment.
Figure 1C:
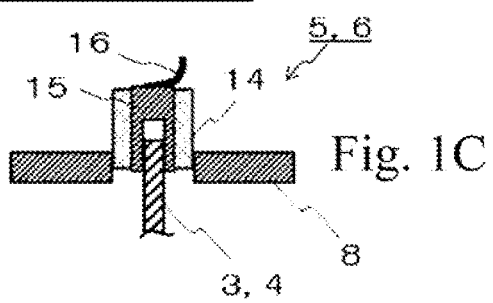
Figure 1B:
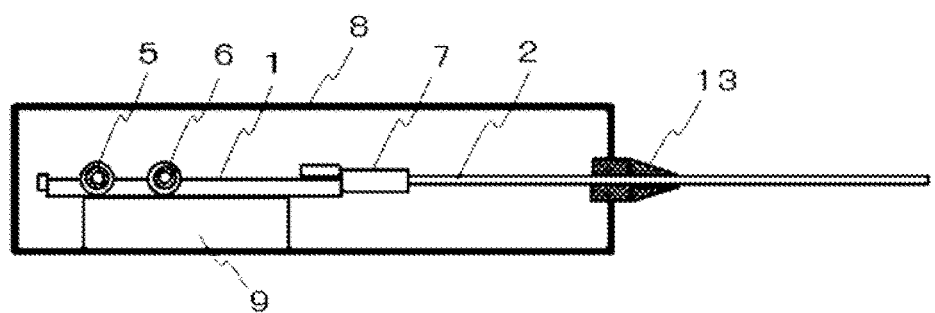

Hereafter, the optical voltage probe of the present invention will be explained in detail using the embodiments with reference to the drawings. Note that the same reference numerals are added to the same elements in the explanation of the drawings and the repeated explanation will be omitted First Embodiment FIGS. 1A to 1C are configuration diagrams schematically showing the configuration of the optical voltage probe concerning the first embodiment. FIG. 1A is a plan view of the transmission-type, FIG. 1B shows a side view of the transmission-type, and FIG. 1C shows the partially enlarged cross-sectional view of a contact terminal attachment portion.

In FIG. 1, an optical voltage probe 10 of the present embodiment includes two modulation electrodes 11 and 12. The optical voltage probe 10 also includes an optical modulator 1 that modulates an intensity of an incident light depending on a voltage between the modulation electrode 11 and the modulation electrode 12. The optical voltage probe 10 also includes an input optical fiber and an output optical fiber that are connected with the optical modulator 1. Furthermore, the optical voltage probe 10 includes contact terminal attachment portions 5 and 6 to which two contact terminals 3 and 4 can be attached, where the two contact terminals 3 and 4 are configured to be in contact with points to be measured and the contact terminal attachment portions 5 and 6 are respectively connected with the modulation electrodes 11 and 12. In the present embodiment, the optical modulator 1 is a reflection type optical modulator where the incident light is reflected inside the optical modulator 1 to change a direction of the incident light. The input optical fiber from which the light is inputted in the optical modulator 1 and the output optical fiber to which the light is outputted from the optical modulator 1 are formed by one input/output (input and output) optical fiber 2. The tip of the input/output optical fiber 2 is inserted into a ferrule 7 and fixed so that the end surface of the input/output optical fiber 2 is adhered and fixed with the end surface of the input/output terminal of the optical modulator 1.

In addition, a part of the optical modulator 1 and the input/output optical fiber 2 is housed inside a package 8 which is made of a metal and formed in a rectangular parallelepiped shape. The optical modulator 1 is fixed to a seat 9 which is fixed to the package 8. The input/output optical fiber 2 is fixed to the package 8 by a rubbery fixing member 13.

As shown in FIG. 1C, each the contact terminal attachment portions 5 and 6 is composed of a tubular (cylindrical) insulator 14 and a tubular (cylindrical) terminal insertion portion 15 made of metal and housed inside the insulator 14. When performing the measurement, the contact terminal 3 is inserted into the terminal insertion portion 15 of the contact terminal attachment portion 5 and the contact terminal 4 is inserted into the terminal insertion portion 15 of the contact terminal attachment portion 6. A lead wire 16 is attached to the terminal insertion portion 15 to connect the terminal insertion portion 15 with the modulation electrodes 11 or 12. The insulator 14 is fixed to the package 8. In the present embodiment, the contact terminal attachment portions 5 and 6 are installed inner than a position of a surface of the package 8. In addition, a center interval between the two contact terminal attachment portions 5 and 6 is approximately 5 mm. When the two contact terminals 3 and 4 are attached, an interval P between the two contact terminals 3 and 4 is also approximately 5 mm. As described above, since the interval between the contact terminals is separated from each other by 3 mm or more, high input impedance can be obtained.

Next, the measurement system using the optical voltage probe 10 of the present embodiment will be explained.

Figure 2:
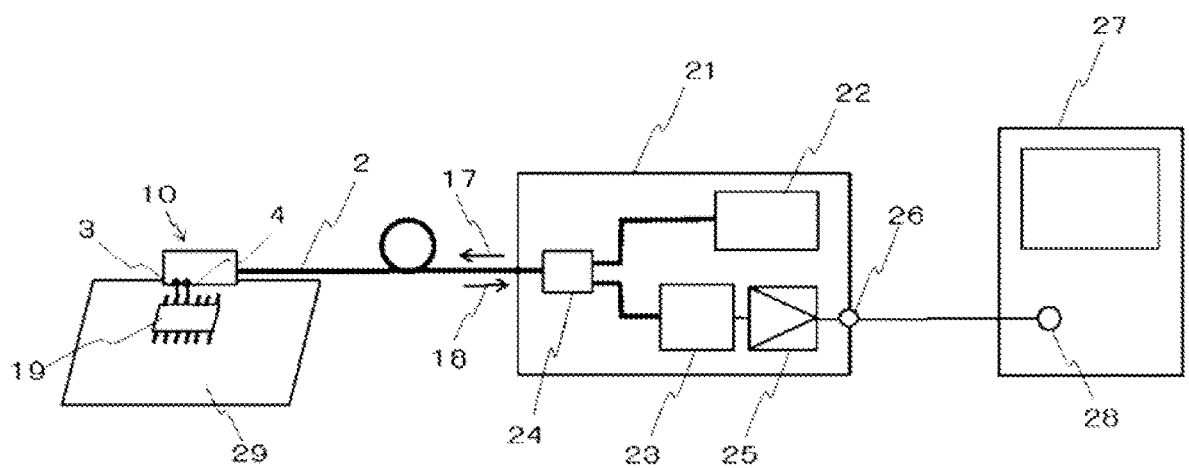
FIG. 2 is a block diagram of a measurement system using the optical voltage probe concerning the first embodiment.

FIG. 2 is a block diagram of the measurement system using the optical voltage probe concerning the first embodiment. As shown in FIG. 2, an incident light 17 is transmitted from an optical transmission/reception unit 21 to the optical voltage probe 10 through the input/output optical fiber 2. An optical intensity modulation signal 18 outputted from the optical modulator 1 is inputted to the optical transmission/reception unit 21 through the same input/output optical fiber 2.

The optical transmission/reception unit 21 includes a light source 22 such as a semiconductor laser, an O/E (Optical/Electrical) converter 23, a transmission/reception separator 24 for separating the incident light 17 from the optical intensity modulation signal 18, and an amplifier 25. An emission light emitted from the light source 22 is coupled into the input/output optical fiber 2 through the transmission/reception separator 24. The optical intensity modulation signal 18 returned from the input/output optical fiber 2 is inputted to the O/E converter 23 through the transmission/reception separator 24. The optical intensity modulation signal 18 is converted into the electric signal in the O/E converter 23, and the electric signal is amplified by the amplifier 25 and output to an output terminal 26. The outputted electric signal is inputted to an input terminal 28 of a measuring instrument 27 such as an oscilloscope. The transmission/reception separator 24 can be formed by one of an optical circulator, an optical fiber splitter and a semi-transparent mirror.

FIG. 2 shows the case where the voltage signal applied between two terminals of an electric component 19 incorporated in an electric circuit board 29 as the points to be measured. The contact terminals 3 and 4 of the optical voltage probe 10 are brought into contact with two terminals of the electric component 19 to be measured.

As explained above, the voltage signal inputted through the contact terminals 3 and 4 is led to the modulation electrodes 11 and 12 and the voltage signal is converted into the optical intensity modulation signal 18 by the optical modulator 1. The optical intensity modulation signal 18 is converted into the electric signal in the optical transmission/reception unit 21. The voltage waveform of the electric signal is observed by the measuring instrument 27, for example. Thus, the waveform of the voltage signal applied between the two terminals of the electric component 19 can be recognized.

Figure 3A:
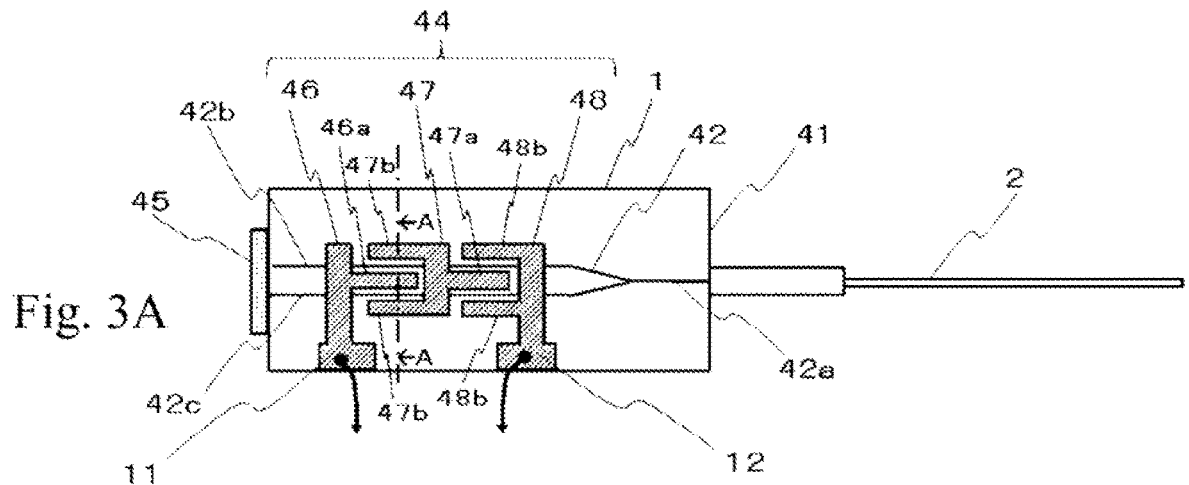
FIGS. 3A and 3B are diagrams schematically showing an example of the configuration of a reflection type optical modulator included in the optical voltage probe of the first embodiment.
Figure 3B:
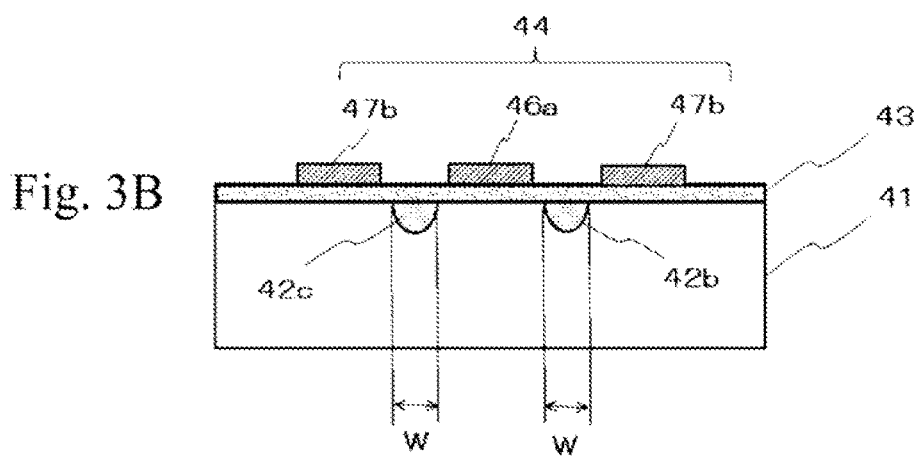

FIGS. 3A and 3B are diagrams schematically showing an example of the configuration of the reflection type optical modulator 1 included in the optical voltage probe 10 of the present embodiment. FIG. 3A is a plan view and FIG. 3B is an A-A cross-sectional view.

In FIGS. 3A and 3B, the optical modulator 1 is composed of: a substrate 41 formed by cutting (X cutting) a lithium niobate (LiNbO3) crystal which is a crystal having an electrooptic effect; a branch interference type optical waveguide 42 formed on an upper surface side of the substrate 41 by Ti diffusion; a buffer layer 43 coated on an upper surface side of the substrate 41; a modulation electrode portion 44 including the modulation electrodes 11 and 12 coated on the buffer layer 43; and a light reflecting portion 45 provided on one of end portions of the substrate 41. The modulation electrode portion 44 is a two-layered film of chrome (Cr) and aurum (Au) formed by sputtering or the like.

The branch interference type optical waveguide 42 is composed of: an input/output optical waveguide 42a extending toward the direction from which the input (incident) light is inputted; and two phase shift optical waveguides 42b, 42c extended from the input/output optical waveguide 42a and branched into two. In the input/output optical waveguide 42a and the phase shift optical waveguides 42b, 42c, the widths W, which are vertical to the direction of extending the waveguides 42a, 42b and 42c, are equal to each other. In addition, the lengths of the phase shift optical waveguides 42b, 42c in the extending direction are approximately equal to each other.

The widths W of the optical waveguide are within the range of 5 to 12 μm. The lengths of the phase shift optical waveguides 42b, 42c in the extending direction are within the range of 10 to 30 mm. The phase shift optical waveguides 42b, 42c are separated from each other and extended in parallel to each other so that the center parts of them are separated by a predetermined distance in the width direction. The distance between the phase shift optical waveguides 42b, 42c at the center parts is within the range of 15 to 50 μm. Note that the widths W of the input/output optical waveguide 42a and the phase shift optical waveguides 42b, 42c, the lengths of the phase shift optical waveguides 42b, 42c, and the distance between the phase shift optical waveguides 42b, 42c are not particularly limited and can be arbitrarily specified.

The buffer layer 43 is provided for the purpose of preventing a part of the light propagating through the optical waveguides 42 from being absorbed by the modulation electrode portion 44. The buffer layer 43 is mainly made of silica ($SiO_2$) film or the like and the thickness of the buffer layer 43 is approximately 0.1 to 1.0 μm.

In the optical modulator 1, the modulation electrode portion 44 is composed of split electrodes formed by three electrodes 46, 47, 48 which are divided from each other in a longitudinal direction of the branch interference type optical waveguide 42 and capacitively coupled with each other. Note that the electrode 46 is a part of the modulation electrode 11 and the electrode 48 is a part of the modulation electrode 12. The electrode 46, which is a part of the modulation electrode 11 located at the signal input side, includes an electrode portion 46a arranged between the phase shift optical waveguides 42b, 42c. The electrode 47 includes: electrode portions 47b arranged on both sides of the electrode portion 46a to sandwich the phase shift optical waveguides 42b, 42c; and an electrode portion 47a arranged between the phase shift optical waveguides 42b, 42c. The electrode 48, which is a part of the modulation electrode 12, includes an electrode portion 48b arranged on both sides of the electrode portion 47a to sandwich the phase shift optical waveguides 42b, 42c. Between the modulation electrodes 11 and 12, the electrodes 46, 47 and the electrodes 47, 48 are capacitively coupled with each other and arranged in series.

The input/output terminal of the input/output optical fiber 2 is coupled with the light input/output end of the input/output optical waveguide 42a of the substrate 41. The light reflecting portion 45 reflects the light incident from the input/output optical waveguide 42a and propagated through the phase shift optical waveguides 42b, 42c to return the light and make the light propagate from the phase shift optical waveguides 42b, 42c to the input/output optical waveguide 42a. When the voltage is applied between the modulation electrodes 11 and 12, an electric field is applied to the two phase shift optical waveguides 42b, 42c (i.e., between the electrode portions 46a and 47b and between the electrode portion 47a and 48b) in an opposite direction to each other. Consequently, the refractive index change occurs in the phase shift optical waveguides 42b, 42c in an opposite direction to each other. Thus, a phase shift having polarity opposite to each other is made in the light passing through the phase shift optical waveguides 42b, 42c. The intensity change occurs when the lights are joined since the lights are interfered with each other. Consequently, the optical intensity modulation signal having the light intensity change depending on the voltage applied between the modulation electrodes 11 and 12 can be obtained.

Figure 4:
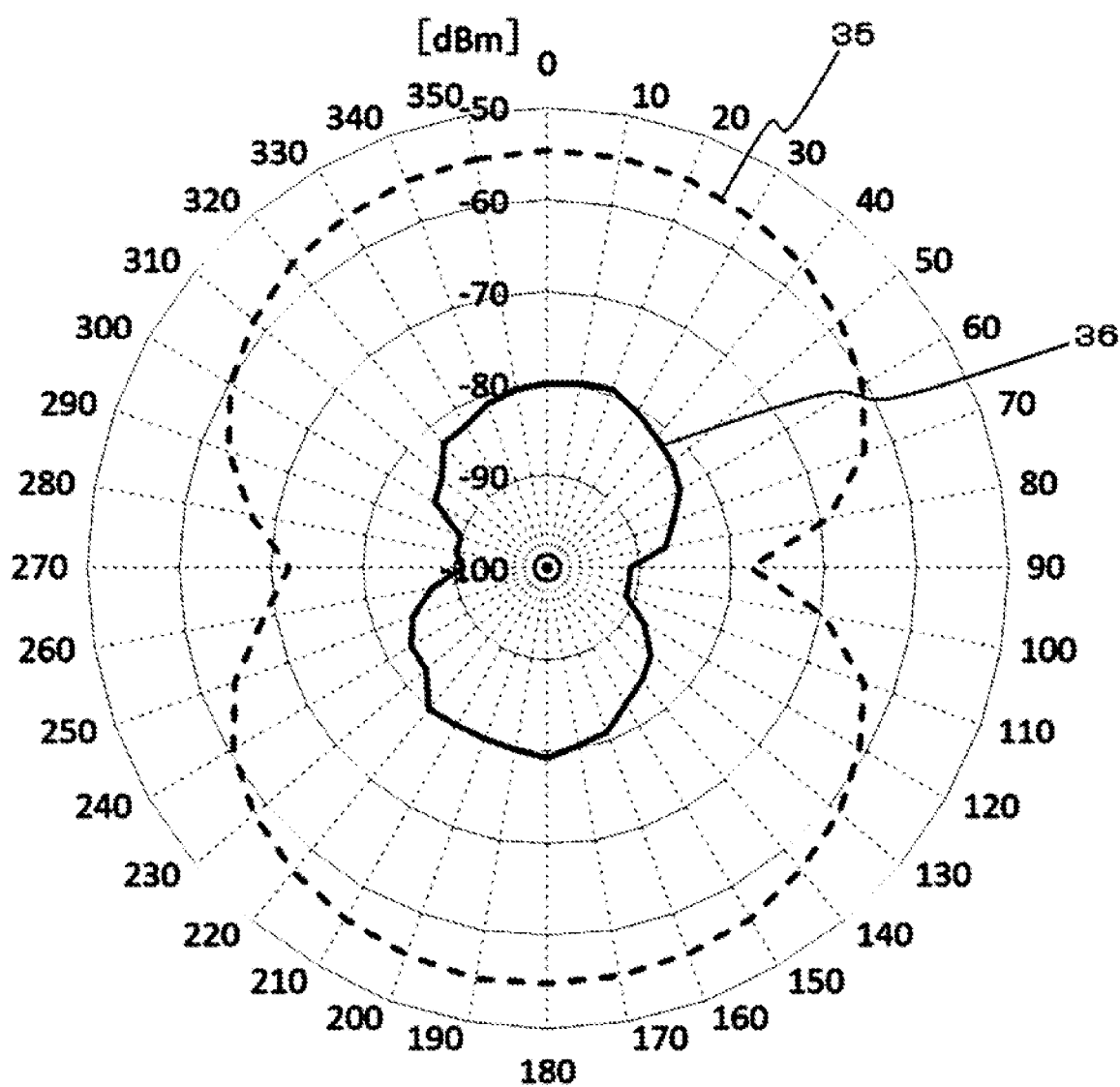
FIG. 4 is a diagram showing an example of the result measuring the shielding effect of the electric wave shielded by a package of the optical voltage probe of the first embodiment.

FIG. 4 is a diagram showing an example of the result measuring the shielding effect of the electric wave shielded by the package 8 of the optical voltage probe of the present embodiment. The output signal intensity outputted from the output terminal 26 is shown in a circle graph when an electric wave having a measurement frequency is applied while the contact terminal attachment portions are opened. The output signal intensity is measured by changing the incident direction of the electric wave by 360 degrees with the longitudinal direction of the package 8 as a rotation axis. The center of the circle graph indicates the output intensity of −100 dBm and the outermost circle indicates −50 dBm. The measured values 35 shown by broken lines are the values measured in a state that the optical modulator 1 which is same as the optical voltage probe 10 of the first embodiment is included in a package made of resin having the same shape as the package 8. The measured values 36 shown by solid lines are the values measured by using the optical voltage probe 10 of the present embodiment using the package 8. It is shown that the attenuation of 15 dB or more could be obtained in the present embodiment in all directions compared to the case of using the package made of resin although a little attenuation could be obtained when using the package made of resin than the case of without using the package. Consequently, it is confirmed that enough shielding effect could be obtained by the package 8.

Second Embodiment

Figure 5A:
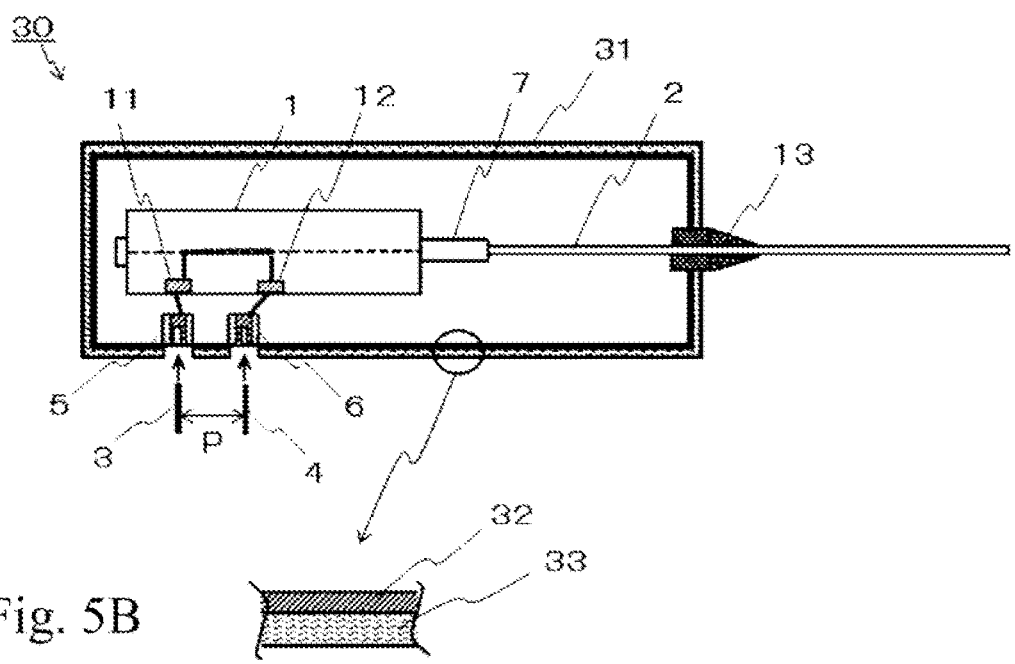
FIGS. 5A and 5B are diagrams schematically showing a configuration of an optical voltage probe concerning the second embodiment.
Figure 5B:
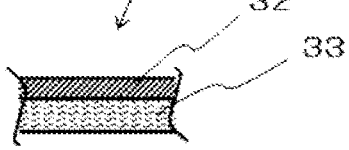

FIGS. 5A and 5B are diagrams schematically showing a configuration of the optical voltage probe concerning the second embodiment. FIG. 5A is a plan view of the transmission-type and FIG. 5B is a partially enlarged cross-sectional view showing the cross-sectional configuration of the package. As shown in FIGS. 5A and 5B, in an optical voltage probe 30 of the second embodiment, the optical modulator 1 same as that of the first embodiment is installed in a package 31 and fixed to the package 31. Compared to the optical voltage probe 10 of the first embodiment, the configurations of the optical voltage probe 30 are same as those of the optical voltage probe 10 except for the package 31. In the present embodiment, the package 31 is formed by installing a sheet-shaped electric wave absorber 33 on a surface of a metal package 32 made of metal for reducing the reflection of an electromagnetic wave reflected by the package 31.

Here, the metal package 32 is formed by the same material having the same shape as the package 8 of the first embodiment. The electric wave absorber 33 is a sheet made of a dielectric radio wave absorption material formed by mixing carbon powder or the like with dielectric materials such as rubber, urethane foam and polystyrene foam for increasing an apparent dielectric loss. The electric wave absorber 33 is adhered to an exposed surface of the contact terminal attachment portions 5 and 6 of the metal package 32 and an entire surface except for the fixing member 13 of the input/output optical fiber 2.

In the present embodiment, the reflection of the electromagnetic wave noise reflected by the package 31 placed near the points to be measured is reduced by the electric wave absorber 33. Thus, the noise is prevented from entering in the circuit of the points to be measured, and the influence of the electromagnetic wave noise during the measurement can be further reduced. In addition, since it can be formed only by adhering the sheet of the electric wave absorber on the surface, the manufacturing process can be simplified.

Third Embodiment

FIGS. 6A and 6B are diagrams schematically showing a configuration of the optical voltage probe concerning the third embodiment. FIG. 6A is a plan view of the transmission-type and FIG. 6B is a partially enlarged cross-sectional view showing the cross-sectional configuration of the package. As shown in FIGS. 6A and 6B, in an optical voltage probe 50 of the present embodiment, the optical modulator 1 same as that of the first embodiment is installed in a package 51 and fixed to the package 51. Compared to the optical voltage probe 10 of the first embodiment, the configurations of the optical voltage probe 50 are same as those of the optical voltage probe 10 except for the package 51. In the present embodiment, the package 51 is formed by adhering a metal sheet 53 on the surface of a resin package 52 made of resin and further adhering a sheet-shaped electric wave absorber 54 same as the electric wave absorber 33 of the second embodiment on it.

Here, the metal package 52 is formed by the same material having the same shape as the package 8 of the first embodiment. The metal sheet 53 is a tape made of copper, for example. The metal sheet 53 and the electric wave absorber 54 are adhered to an exposed surface of the contact terminal attachment portions 5 and 6 of the metal package 52 and an entire surface except for the fixing member 13 of the input/output optical fiber 2. In the present embodiment, the contact terminal attachment portions 5 and 6 are fixed to the resin package 52.

In the present embodiment, same as the second embodiment, in addition to the effect of shielding the electromagnetic noise, the reflection of the electromagnetic wave noise reflected by the package 51 is reduced and the influence of the electromagnetic wave noise to the circuit to be measured can be reduced. Furthermore, in the present embodiment, since the package is made mainly of resin, the weight and cost of the optical voltage probe can be reduced.

Fourth Embodiment

Figure 7:
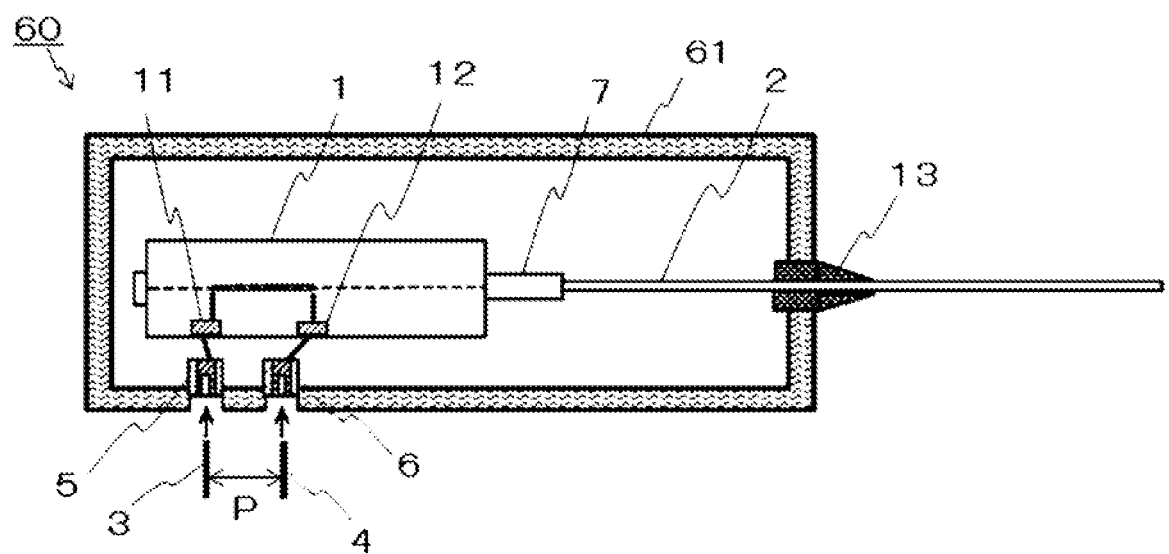
FIG. 7 is a plan view of the transmission-type schematically showing the configuration of an optical voltage probe of the fourth embodiment.

FIG. 7 is a plan view of the transmission-type schematically showing the configuration of the optical voltage probe of the fourth embodiment. As shown in FIG. 7, in an optical voltage probe 60 of the present embodiment, the optical modulator 1 same as that of the first embodiment is installed in a package 61 and fixed to the package 61. Compared to the optical voltage probe 10 of the first embodiment, the configurations of the optical voltage probe 60 are same as those of the optical voltage probe 10 except for the package 61. In the present embodiment, the package 61 is formed by using the electric wave absorber.

Here, the package 61 has the same shape as the package 8 of the first embodiment except for the thickness. The contact terminal attachment portions 5 and 6 are fixed to the package 61. For example, the magnetic radio wave absorption material using ferrite or the like can be used for the electric wave absorber which is a material of the package 61. The dielectric radio wave absorption material and the magnetic radio wave absorption material can be also used as long as necessary strength can be obtained. In addition, it is also possible to combine two or more electric wave absorber materials in a laminated state. For example, it is possible to provide the electric wave absorber made of the same material as the second embodiment and the third embodiment on the surface of the package made of the magnetic radio wave absorption material.

In the present embodiment, same as the second embodiment, in addition to the effect of shielding the electromagnetic noise, the reflection of the electromagnetic wave noise reflected by the package 61 can be reduced.

As described above, an optical voltage probe capable of correctly measuring the voltage signal of the point to be measured without being influenced by a surrounding electromagnetic wave noise can be obtained by the present invention. In particular, the influence of the surrounding electromagnetic wave noise cannot be ignored in the device controlled by high power signals such as a driving circuit and a control circuit of the automobile since large electromagnetic wave noise may be generated. For example, when the measurement of the driving circuit or the control circuit of the automobile is performed by using the above described optical voltage probe, the wave shape or the like of the voltage signal between two points to be measured can be correctly measured. In addition, also in the electric circuit board placed near the driving circuit or the control circuit of the automobile, the wave shape or the like of the voltage signal between two points to be measured can be correctly measured. Furthermore, when the wave shape or the like of the voltage signal between two points to be measured is correctly measured near the driving circuit or the control circuit of the automobile, the noise at that point may be measured is some cases.

It goes without saying that the present invention is not limited to the above described embodiments and the present invention can be variously modified in accordance with various purposes. For example, the type of the optical modulator to be used is not limited to the reflection type. A transmission-type optical modulator can be also used. In addition, when the sprit electrode is used for the modulation electrode, the number of splitting can be arbitrarily specified according to the frequency, amplitude and the like of the target voltage to be measured. It is not necessary to form the modulation electrode by the sprit electrode. The shape, structure, connection, fixing method and the like of the contact terminal and the contact terminal attachment portions can be selected according to the purpose. In addition, the material of the package can be selected according to the shielding performance and the reflection performance of the target electromagnetic wave. The shape and the structure of the package can be arbitrarily selected. For example, in addition to the rectangular parallelepiped shape of the above described embodiment, a cylindrical shape or the like can be also used.

DESCRIPTION OF THE REFERENCE NUMERALS

1: optical modulator
2: input/output optical fiber
3, 4: contact terminal
5, 6: contact terminal attachment portion
7: ferrule
8, 31, 51, 61: package
9: seat
10, 30, 50, 60: optical voltage probe
11, 12: modulation electrode
13: fixing member
14: insulator
15: terminal insertion portion
16: lead wire
17: incident light
18: optical intensity modulation signal
19: electric component
21: optical transmission/reception unit
22: light source
23: O/E converter
24: transmission/reception separator
25: amplifier
26: output terminal
27: measuring instrument
28: input terminal
29: electric circuit board
32: metal package
33, 54: electric wave absorber
35, 36: measured values
41: substrate
42: branch interference type optical waveguide
42a: input/output optical waveguide
42b, 42c: phase shift optical waveguide
43: buffer layer
44: modulation electrode portion
45: light reflecting portion
46, 47, 48: electrode
46a, 47a, 47b, 48b: electrode portion
52: resin package
53: metal sheet

The invention claimed is:

1. An optical voltage probe comprising:
an optical modulator having at least two modulation electrodes, the optical modulator being configured to modulate an intensity of an incident light depending on a voltage between the two modulation electrodes and output the incident light which is modulated;
an input optical fiber that is connected with the optical modulator;
an output optical fiber that is connected with the optical modulator;
two contact terminals or two contact terminal attachment portions to which the two contact terminals can be detachably attached and contacted, the two contact terminals being connected with the two modulation electrodes and configured to be in contact with points to be measured;
a package that houses the optical modulator, a part of the input optical fiber and a part of the output optical fiber, wherein
a voltage signal induced between the two modulation electrodes via the two contact terminals is converted into an optical intensity modulation signal by the optical modulator and the optical intensity modulation signal is outputted through the output optical fiber so that the voltage signal induced between the two modulation electrodes is measured based on the optical intensity modulation signal,
the package has a layered or sheet-shaped metal body covering an inside of the package, and
when an electric wave having a measurement frequency is applied while the two contact terminals or the two contact terminal attachment portions are opened, the package exhibits a shielding effect of attenuating the electric wave by 15 dB or more compared to an output signal intensity measured without providing the package.

2. An optical voltage probe comprising:
an optical modulator having at least two modulation electrodes, the optical modulator being configured to modulate an intensity of an incident light depending on a voltage between the two modulation electrodes and output the incident light which is modulated;
an input optical fiber that is connected with the optical modulator;
an output optical fiber that is connected with the optical modulator;
two contact terminal attachment portions to which two contact terminals can be detachably attached and contacted, the two contact terminals being connected with the two modulation electrodes and configured to be in contact with the points to be measured; and
a package that houses the optical modulator, a part of the input optical fiber and a part of the output optical fiber, wherein
the two contact terminal attachment portions are installed inner than a position of a surface of the package,
a voltage signal induced between the two modulation electrodes via the two contact terminal is converted into an optical intensity modulation signal by the optical modulator and the optical intensity modulation signal is outputted through the output optical fiber so that the voltage signal induced between the two modulation electrodes is measured based on the optical intensity modulation signal, and
when an electric wave having a measurement frequency is applied while the two contact terminal attachment portions are opened, the package exhibits a shielding effect of attenuating the electric wave by 15 dB or more compared to an output signal intensity measured without providing the package.

3. An optical voltage probe comprising:
an optical modulator having at least two modulation electrodes, the optical modulator being configured to modulate an intensity of an incident light depending on a voltage between the two modulation electrodes and output the incident light which is modulated;

an input optical fiber that is connected with the optical modulator;

an output optical fiber that is connected with the optical modulator;

two contact terminals or two contact terminal attachment portions to which the two contact terminals can be detachably attached and contacted, the two contact terminals being connected with the two modulation electrodes and configured to be in contact with points to be measured;

a package that houses the optical modulator, a part of the input optical fiber and a part of the output optical fiber, wherein a voltage signal induced between the two modulation electrodes via the two contact terminals is converted into an optical intensity modulation signal by the optical modulator and the optical intensity modulation signal is outputted through the output optical fiber so that the voltage signal induced between the two modulation electrodes is measured based on the optical intensity modulation signal, the package includes an electric wave absorber for reducing a reflection of an electromagnetic wave arrived from an outside of the package and reflected by the package, and when an electric wave having a measurement frequency is applied while the two contact terminals or the two contact terminal attachment portions are opened, the package exhibits a shielding effect of attenuating the electric wave by 15 dB or more compared to an output signal intensity measured without providing the package.

4. The optical voltage probe according to claim 3, wherein the electric wave absorber is a sheet-shaped electric wave absorber provided on a surface of the package.

5. The optical voltage probe according to claim 3, wherein the package exhibits the shielding effect by reducing a transmission of the electric wave by the electric wave absorber.

6. The optical voltage probe according to claim 1, wherein an interval between the two contact terminals or between the two contact terminal attachment portions is 3 mm or more.

7. The optical voltage probe according to claim 1, wherein the optical modulator is a branch interference type optical modulator using an optical waveguide formed on a lithium niobate crystal substrate.

8. The optical voltage probe according to claim 7, wherein the optical modulator is a reflection type optical modulator where the incident light is reflected inside the optical modulator to change a direction of the incident light, and the input optical fiber and the output optical fiber are formed by one input/output optical fiber.

9. The optical voltage probe according to claim 7, wherein at least one electrode capacitively coupled with the two modulation electrodes is provided between the two modulation electrodes.

10. The optical voltage probe according to claim 4, wherein
the package exhibits the shielding effect by reducing a transmission of the electric wave by the electric wave absorber.

11. The optical voltage probe according to claim 2, wherein
an interval between the two contact terminals or between the two contact terminal attachment portions is 3 mm or more.

12. The optical voltage probe according to claim 3, wherein
an interval between the two contact terminals or between the two contact terminal attachment portions is 3 mm or more.

13. The optical voltage probe according to claim 2, wherein
the optical modulator is a branch interference type optical modulator using an optical waveguide formed on a lithium niobate crystal substrate.

14. The optical voltage probe according to claim 3, wherein
the optical modulator is a branch interference type optical modulator using an optical waveguide formed on a lithium niobate crystal substrate.

15. The optical voltage probe according to claim 4, wherein
the optical modulator is a branch interference type optical modulator using an optical waveguide formed on a lithium niobate crystal substrate.

16. The optical voltage probe according to claim 5, wherein
the optical modulator is a branch interference type optical modulator using an optical waveguide formed on a lithium niobate crystal substrate.

17. The optical voltage probe according to claim 13, wherein
the optical modulator is a reflection type optical modulator where the incident light is reflected inside the optical modulator to change a direction of the incident light, and
the input optical fiber and the output optical fiber are formed by one input/output optical fiber.

18. The optical voltage probe according to claim 14, wherein
the optical modulator is a reflection type optical modulator where the incident light is reflected inside the optical modulator to change a direction of the incident light, and
the input optical fiber and the output optical fiber are formed by one input/output optical fiber.

19. The optical voltage probe according to claim 13, wherein
at least one electrode capacitively coupled with the two modulation electrodes is provided between the two modulation electrodes.

20. The optical voltage probe according to claim 14, wherein
at least one electrode capacitively coupled with the two modulation electrodes is provided between the two modulation electrodes.

* * * * *